(12) United States Patent
Wang

(10) Patent No.: US 8,902,602 B2
(45) Date of Patent: Dec. 2, 2014

(54) COMMUNICATION DEVICE AND EJECTION MECHANISM

(71) Applicants: Fu Tai Hua Industry (Shenzhen) Co., Ltd., Shenzhen (CN); Hon Hai Precision Industry Co., Ltd., New Taipei (TW)

(72) Inventor: Hua-Yong Wang, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 92 days.

(21) Appl. No.: 13/721,077

(22) Filed: Dec. 20, 2012

(65) Prior Publication Data

US 2013/0170114 A1     Jul. 4, 2013

(30) Foreign Application Priority Data

Dec. 28, 2011   (CN) .......................... 2011 1 1047331

(51) Int. Cl.
| | | |
|---|---|---|
| H05K 7/00 | (2006.01) | |
| H05K 1/14 | (2006.01) | |
| H01R 13/62 | (2006.01) | |
| G06K 13/06 | (2006.01) | |
| H05K 7/14 | (2006.01) | |

(52) U.S. Cl.
CPC .............. *H05K 7/1461* (2013.01); *G06K 13/06* (2013.01)
USPC ........................... 361/754; 361/737; 439/159

(58) Field of Classification Search
None
See application file for complete search history.

(56) References Cited

U.S. PATENT DOCUMENTS

| | | | | |
|---|---|---|---|---|
| 5,179,505 A | * | 1/1993 | Matsuo | 361/754 |
| 5,829,996 A | * | 11/1998 | Yamane et al. | 439/310 |
| 6,155,853 A | * | 12/2000 | Kajiura | 439/159 |
| 6,210,188 B1 | * | 4/2001 | Chang | 439/159 |
| 7,811,106 B2 | * | 10/2010 | Lin et al. | 439/159 |
| 7,924,573 B2 | * | 4/2011 | Cheng | 361/754 |
| 2002/0001181 A1 | * | 1/2002 | Kondo | 361/728 |
| 2003/0151901 A1 | * | 8/2003 | Nogami | 361/726 |
| 2003/0161115 A1 | * | 8/2003 | Kadonaga | 361/737 |
| 2004/0047134 A1 | * | 3/2004 | Liu et al. | 361/736 |
| 2005/0007728 A1 | * | 1/2005 | Takahashi et al. | 361/600 |
| 2006/0246757 A1 | * | 11/2006 | Ting et al. | 439/159 |
| 2007/0042622 A1 | * | 2/2007 | Chen et al. | 439/159 |
| 2007/0178733 A1 | * | 8/2007 | Sadatoku | 439/159 |
| 2007/0287312 A1 | * | 12/2007 | Yu et al. | 439/160 |
| 2008/0102669 A1 | * | 5/2008 | Lai | 439/159 |
| 2009/0075507 A1 | * | 3/2009 | Chikashige et al. | 439/159 |

(Continued)

*Primary Examiner* — Hoa C Nguyen
*Assistant Examiner* — Xanthia C Cunningham
(74) *Attorney, Agent, or Firm* — Novak Druce Connolly Bove + Quigg LLP

(57) ABSTRACT

An ejection mechanism includes a top cover, a bottom cover having a first sidewall and a second sidewall, and a sliding assembly. The sliding assembly includes a sliding block and an elastic rod. The sliding block defines a containing groove which is divided into an insertion rail and an ejection rail. The sliding block is configured to move back and force between the first and second sidewalls. A first distal end of the elastic rod is fixed in a fixing hole of the first sidewall. When the card is inserted into the ejection mechanism, the second distal end slides along the insertion rail until the second distal end is locked in a joint of the insertion and ejection rails. When the second distal end of the elastic rod disengages from the locked position by an external force, the second distal end slides in the ejection rail.

20 Claims, 7 Drawing Sheets

(56) References Cited

U.S. PATENT DOCUMENTS

2009/0253280 A1* 10/2009 Yu et al. .................. 439/159
2010/0267260 A1* 10/2010 Yu et al. .................. 439/159
2010/0297862 A1* 11/2010 Tsai ......................... 439/159
2011/0194263 A1* 8/2011 Shen et al. ............... 361/754
2011/0249410 A1* 10/2011 Fujita et al. .............. 361/748
2011/0255218 A1* 10/2011 Pakula et al. ........... 361/679.01
2011/0255252 A1* 10/2011 Sloey et al. .............. 361/752
2011/0294323 A1* 12/2011 Yu et al. .................. 439/159
2012/0134083 A1* 5/2012 Tang ...................... 361/679.01
2012/0307451 A1* 12/2012 Shukla et al. ............ 361/699

* cited by examiner

COMMUNICATION DEVICE AND EJECTION MECHANISM

BACKGROUND

1. Technical Field

The present disclosure relates to card ejection mechanisms, and more particularly, to an ejection mechanism used in a communication device for ejecting a card received in the communication device.

2. Description of Related Art

Many communication devices use removable cards to store information. Such devices include radios, radiotelephones, bank automated teller machines, electronic payment collection equipment, and the like. The cards are used by the devices for security, telephone billing, banking, cinemas, and travel charges. It is desirable that the cards be received into slots in the devices easily and be removed from the devices easily. Most types of ejection mechanisms used in the devices use mechanical structures and circuits to control the removal of the cards from the communication devices, thereby the structures of the ejection mechanisms tend to be complex, and the ejection mechanism may be costly.

What is needed, therefore, is a means which can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Reference will be made to the drawings to describe various embodiments.

Figure 1:
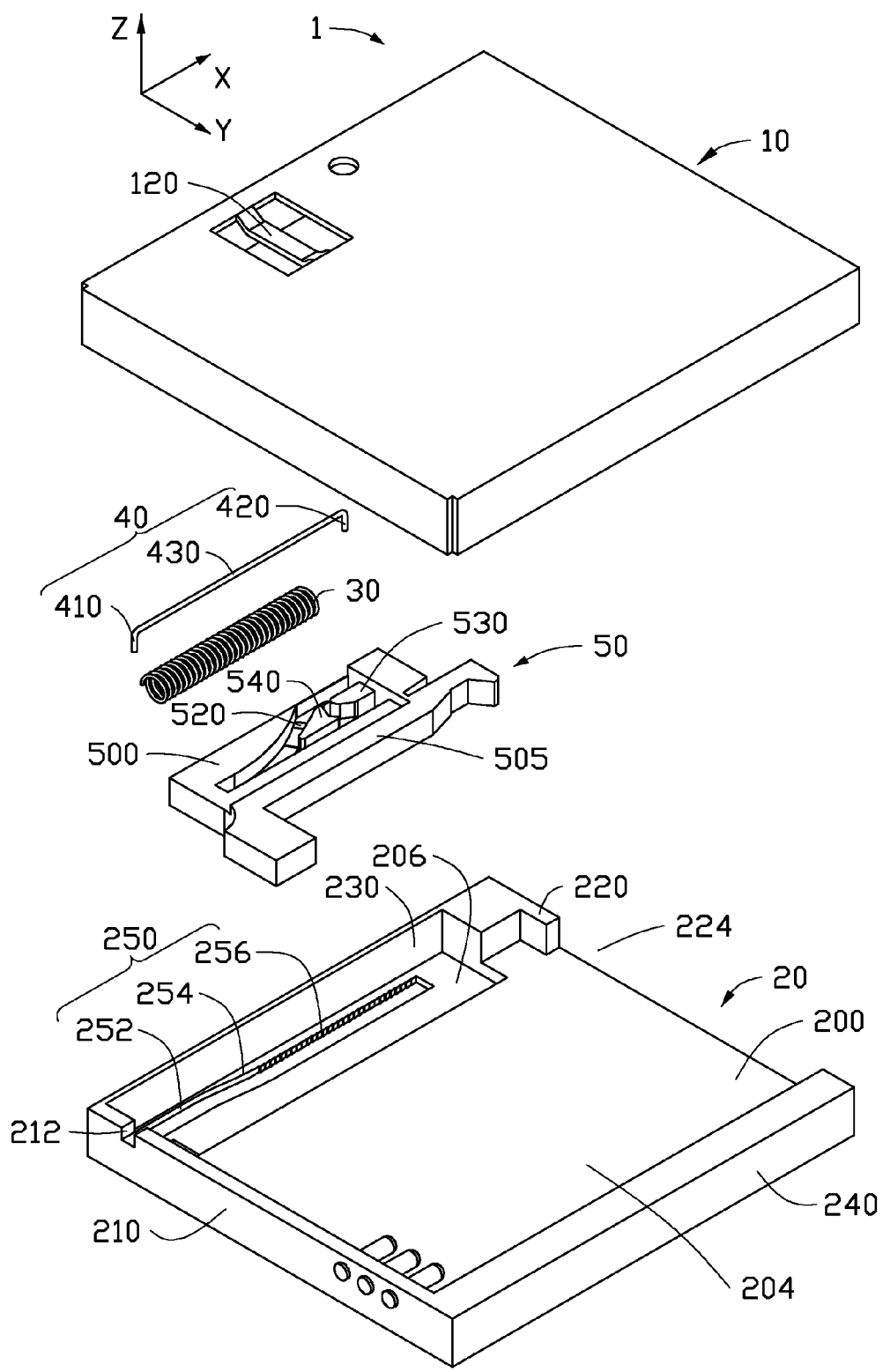
FIG. 1 is an exploded view of an exemplary embodiment of an ejection mechanism for ejecting a card from a communication device, wherein the ejection mechanism includes a bottom cover, a sliding assembly, and a top cover, and the sliding assembly includes a sliding block, an elastic rod, and an elastic member.

Referring to FIG. 1, in one embodiment, an ejection mechanism 1 for ejecting a card from a communication device includes a top cover 10, a bottom cover 20, and a sliding assembly (not labeled). The top cover 10 and the bottom cover 20 cooperate to receive the sliding assembly. The sliding assembly holds the card in place in the communication device and provides an easy means of removing the card out from the communication device. The sliding assembly includes a sliding block 50, an elastic member 30, and an elastic rod 40.

The top cover 10 defines a window (not labeled) at a top surface thereof and an elastic pressing pole 120 connecting with the top surface and extending across the window. The elastic pressing pole 120 has a center portion which is lower than the top surface of the top cover 10.

Figure 2:
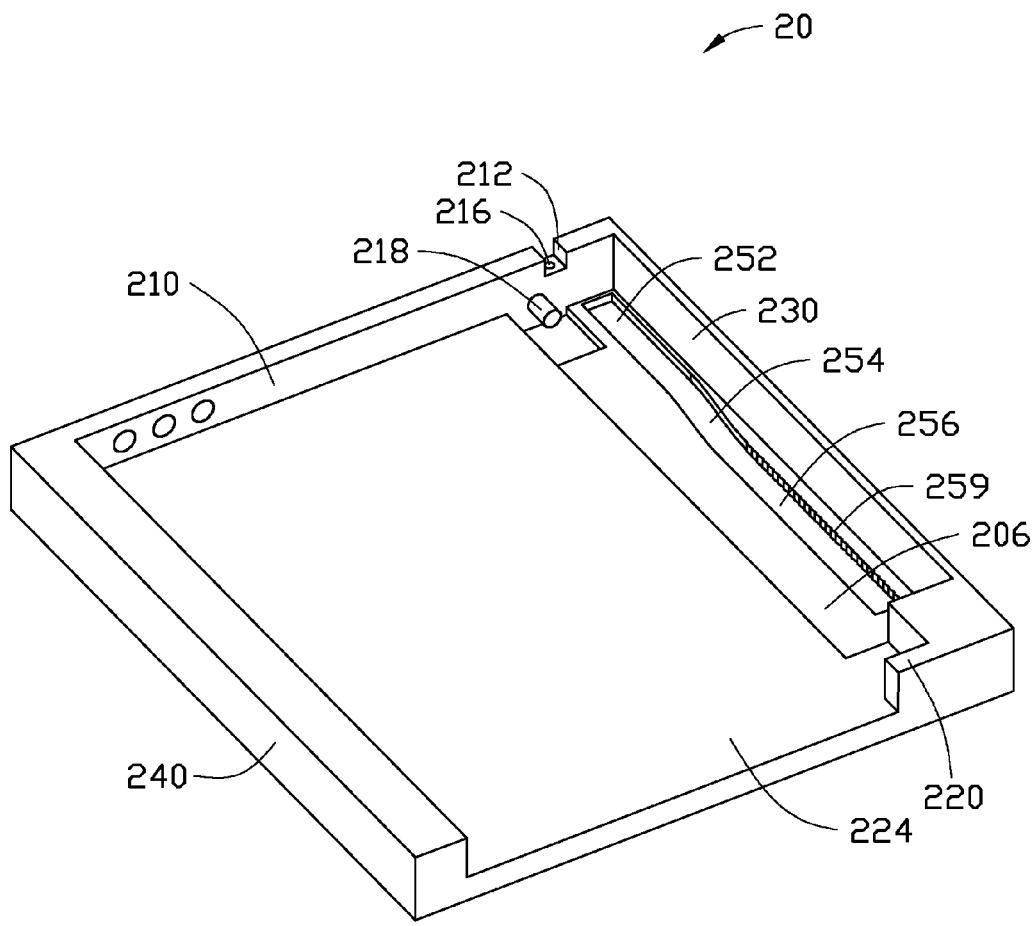
FIG. 2 shows an isometric view of the bottom cover of FIG. 1.

Referring also to FIG. 2, the bottom cover 10 includes a bottom plate 200, a first sidewall 210, a second sidewall 220 opposite to the first sidewall 210, a third sidewall 230, and a fourth sidewall 240 opposite to the third sidewall 230. The bottom plate 200 is rectangular. The first and second sidewalls 210, 220 perpendicularly extend from opposite sides of the bottom plate 200. The third and fourth sidewalls 230, 240 perpendicularly extend from the other two opposite sides of the bottom plate 200. The first and second sidewalls 210, 220 are perpendicular to a first axis (X axis), and the third and fourth sidewalls 230, 240 are perpendicular to a second axis (Y axis) which is perpendicular to the first axis. The sidewalls 210, 220, 230, and 240, and the bottom plate 200, define an accommodating space 204. The second sidewall 220 defines an opening 224, and the opening 224 communicates with the accommodating space 204. The bottom plate 200 defines a limiting groove 206 adjacent to the third sidewall 230. A sliding slot 250 passes through a bottom of the limiting groove 206, and includes a first sliding portion 252, a second sliding portion 256, and a curved sliding portion 254 interconnecting the first and second sliding portions 252, 256. The first and second sliding portions 252, 256 are parallel to the first axis, the first sliding portion 252 is closer to the third sidewall 230 relative to the second sliding portion 256, and the first sliding portion 252 is closer to the first sidewall 210 relative to the second sliding portion 256. Two opposite long sidewalls which bound the second sliding portions 256 include a plurality of teeth 259. A top surface of the first sidewall 210 defines a cutout 212. A side edge of the first sidewall 210 which bounds a rear end of the cutout 212 defines a fixing hole 216. A fixing pole 218 is connected to an inner surface of the first sidewall 210, and the fixing pole 218 extends along the first axis.

The elastic rod 40 includes a first rod portion 410, a second rod portion 420, and a third rod portion 430. The first and second rod portions 410, 420 extend along a third axis (Z axis) perpendicular to the first and second axes. The third rod portion 430 perpendicularly interconnects the first and second rod portions 410, 420.

Figure 3:
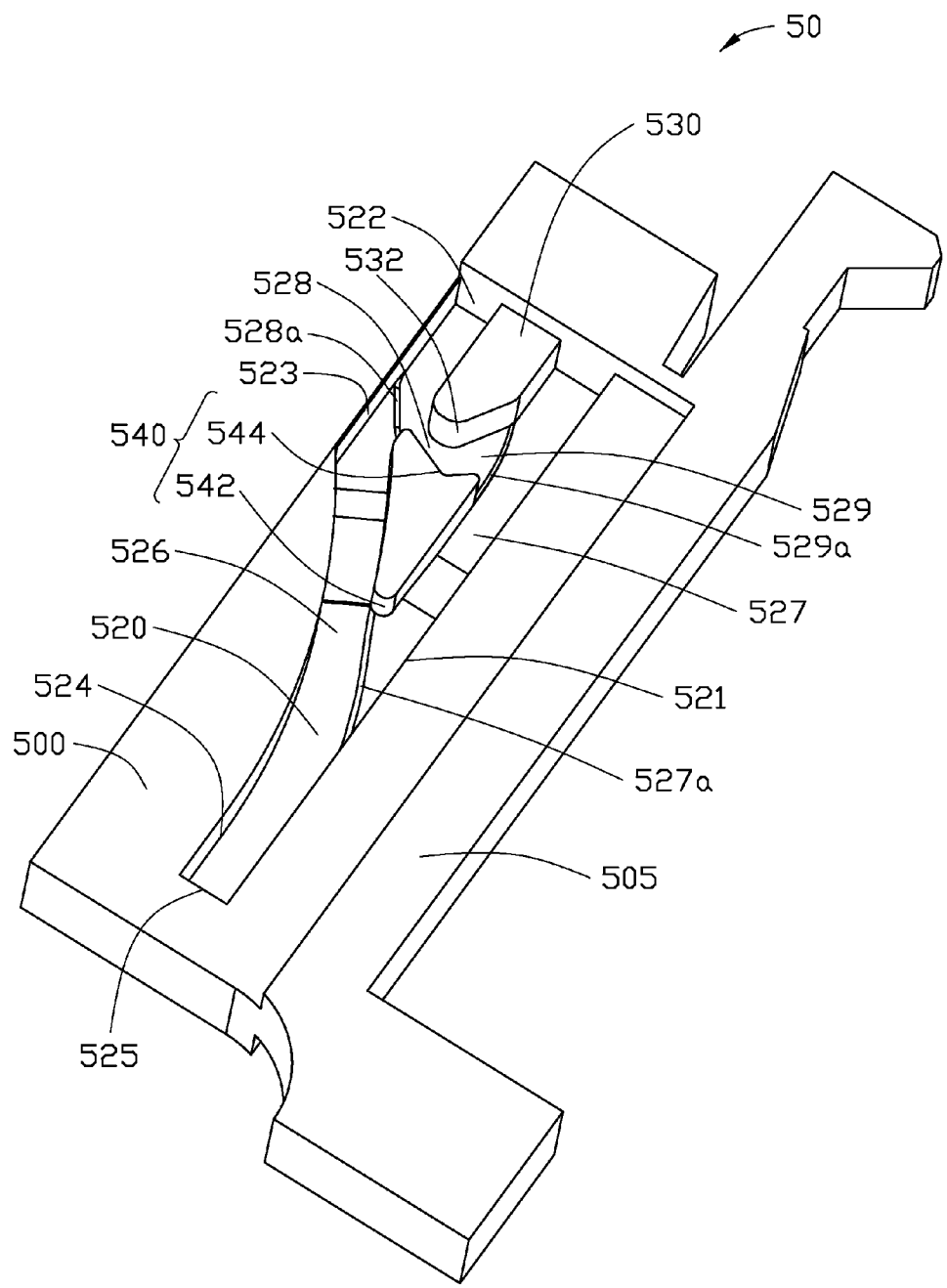
FIG. 3 shows an isometric view of the sliding block of FIG. 1.
Figure 6:
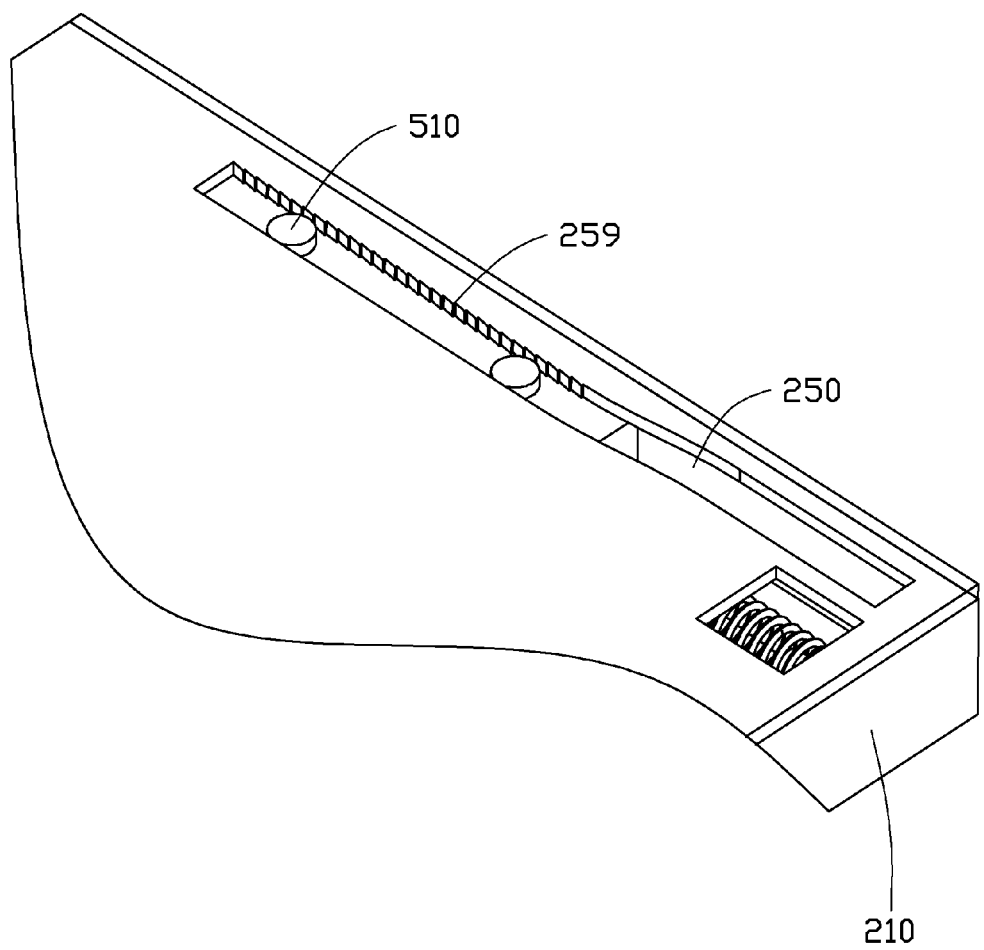
FIG. 6 shows an isometric rear view of the subassembly of the sliding assembly and the bottom cover of FIG. 5.

Referring also to FIGS. 3 and 6, the sliding block 50 includes a main body 500 and a handle portion 505 connected to the main body 500. Two limiting blocks 510 connect to a bottom surface of the main body 500. A top surface of the main body 500 defines a first containing groove 520. A first side edge 521, a second side edge 522, a third side edge 523, a fourth side edge 524, and a fifth side edge 525 are connected end to end to bound the first containing groove 520. The first side edge 521 and the third side edge 523 are parallel and extend along the first axis. The second side edge 522 and the fifth side edge 525 are parallel and extend along the second axis. The fourth side edge 524 is curved, and interconnects the third and fifth side edges 523, 525. A length of the first side edge 521 is greater than a length of the third side edge 523. A length of the second side edge 522 is greater than a length of the fifth side edge 525.

The sliding block 50 further includes a first protrusion 530 and a second protrusion 540, and the first and second protrusions 530, 540 are located in the first containing groove 520. The first protrusion 530 connects to the second side edge 522, and includes a first tip 532 pointing to the fifth side edge 525. The second protrusion 540 is located between the first protrusion 530 and the fifth side edge 525. The second protrusion 540 includes two stacked V-shaped boundaries connected end to end to form a heart-shaped profile. The bottom V-shaped boundary of the second protrusion 540 includes a second tip 542 pointing to the fifth side edge 525, and the top V-shaped boundary of the second protrusion 540 includes a third tip 544 pointing to the fifth side edge 525. The bottom V-shaped boundary of the second protrusion 540 separates the first containing groove 520 into two sliding rails between the first side edge 521 and the fourth side edge 524, such that the first sliding rail 526 is between the fourth side edge 524 and the second tip 542 of the second protrusion 540, and a second sliding rail 527 is between the second tip 542 of the second protrusion 540 and the first side edge 521. The top V-shaped boundary of the second protrusion 540 and the first tip 532 of the first protrusion 530 separate the first containing groove 520 into two sliding rails between the first side edge 521 and the third side edge 523, such that a third sliding rail 528 is between the third side edge 523 and the third tip 544 of the second protrusion 540, and a fourth sliding rail 529 is between the third tip 544 of the second protrusion 540 and the first side edge 521. An elevation of the first sliding rail 526 adjacent to a joint 528a of the first and third sliding rails 526, 528 is higher than an elevation of the third sliding rail 528 adjacent to the joint 528a of the first and third sliding rails 526, 528, thereby forming a first step between the first and third sliding rails 526, 528. An elevation of the fourth sliding rail 529 adjacent to a joint 529a of the fourth and second sliding rails 529, 527 is higher than an elevation of the second sliding rail 527 adjacent to the joint 529a of the fourth and second sliding rails 529, 527, thereby forming a second step between the fourth and second sliding rails 529, 527. The second sliding rail 527 gets gradually higher in elevation along a direction of the second sliding rail 527 near to the fifth side edge 525, and thus the elevation of the second sliding rail 527 adjacent to a joint 527a of the second and first sliding rails 527, 526 is higher than an elevation of the first sliding rail 526 adjacent to the joint 527a of the second and first sliding rails 527, 526, thereby forming a third step between the second and first sliding rails 527, 526.

Figure 4:
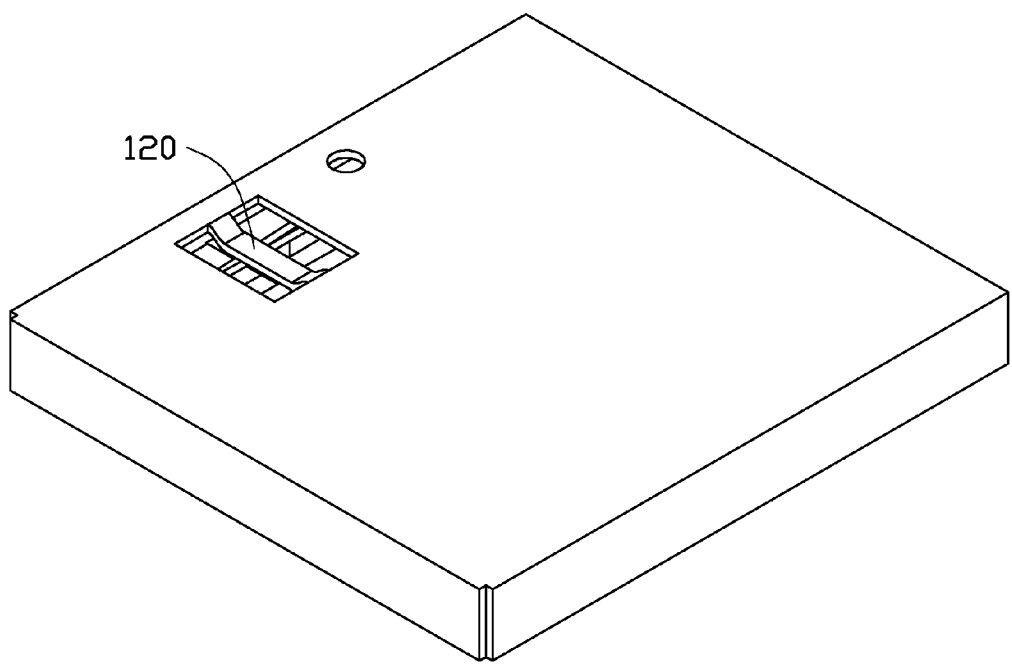
FIG. 4 is an assembled view of the ejection mechanism of FIG. 1.
Figure 5:
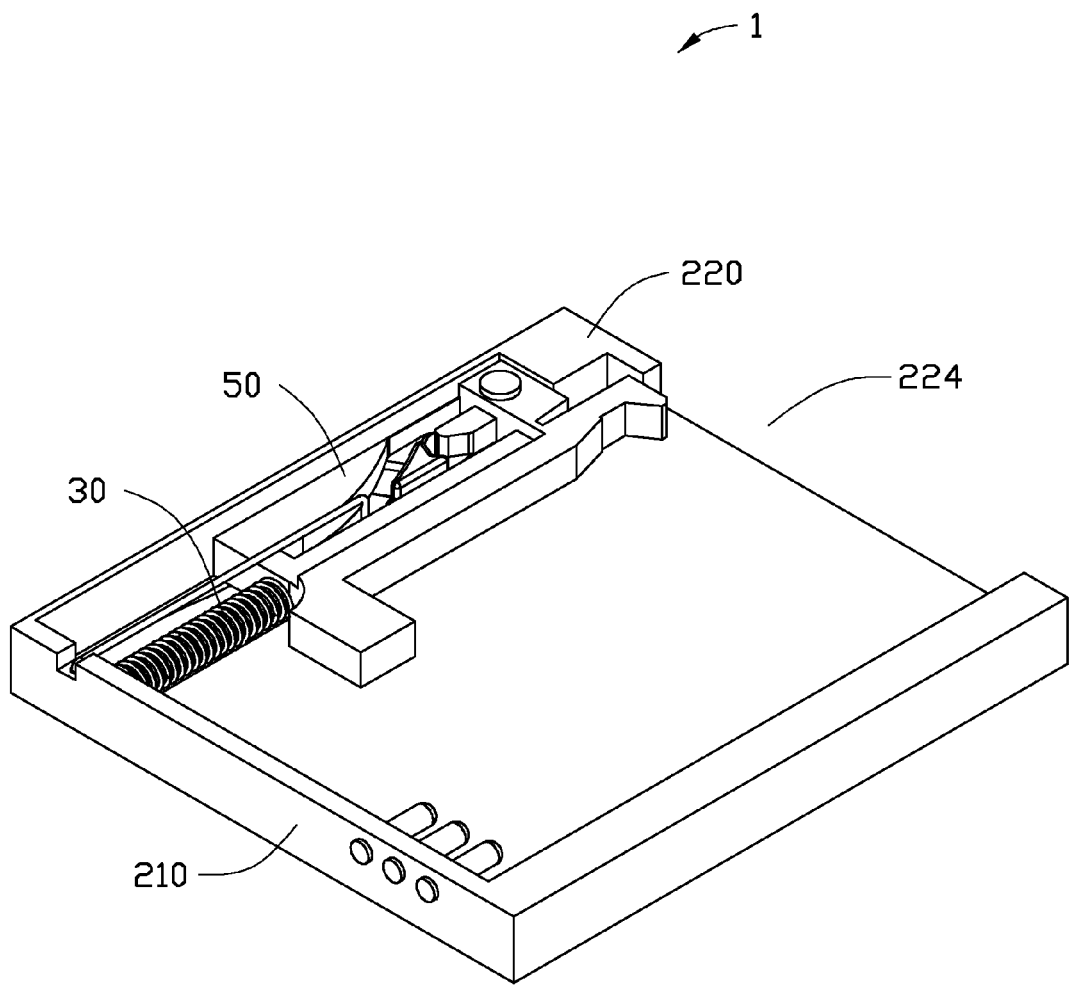
FIG. 5 is an assembled view of a subassembly of the sliding assembly and the bottom cover of FIG. 1.

Referring also to FIGS. 4-6, in assembly of the ejection mechanism 1, the elastic member 30 is sleeved on the fixing pole 218, the sliding block 50 is put into the accommodating space 204, with the elastic member 30 captive between the first sidewall 210 and the main body 500. The limiting blocks 510 of the sliding block 50 are inserted into the sliding slot 250, the main body 500 of the sliding block 50 is thus limited in the limiting groove 206. The handle portion 505 is located outside the limiting groove 206. The sliding block 50 is movable back and forth between the first sidewall 210 and the second sidewall 220 in the accommodating space 204, and the main body 500 is movable back and forth in the limiting groove 206. The first elastic member 30 exerts a resilient force against the blocking wall 228 when is compressed or stretched. A distal end of the first rod portion 410 of the elastic rod 40 is fixed in the fixing hole 216, and a distal end of the second rod portion 420 of the elastic rod 40 is located in the first rail 526 of the first containing groove 520 of the sliding block 50. The top cover 10 engages with the bottom cover 20 to fix the sliding assembly therein, with the elastic pressing pole 120 abutting the third rod portion 430 of the elastic rod 40.

Figure 7:
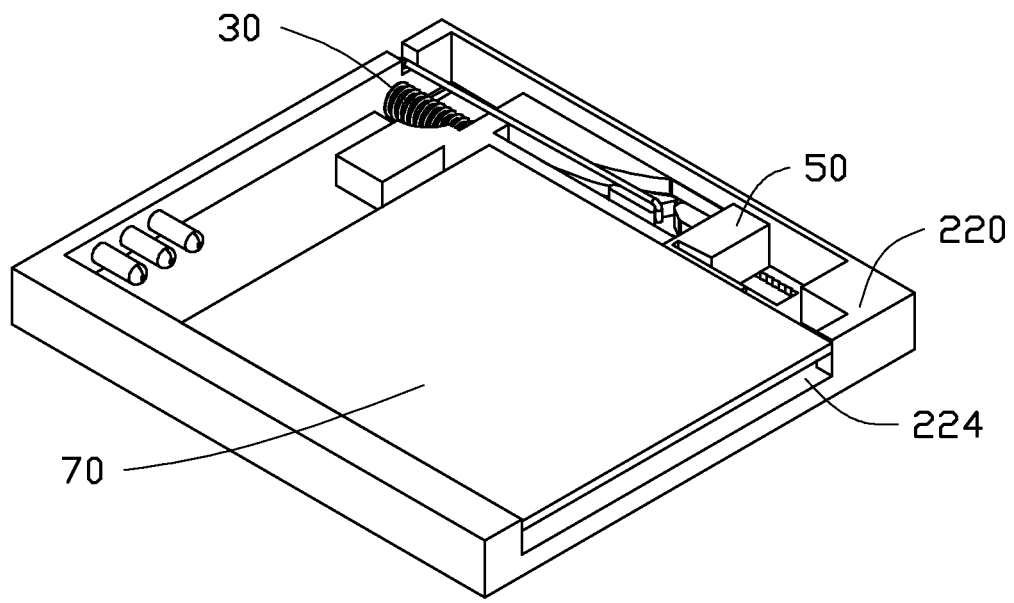
FIG. 7 shows an assembled view of the ejection mechanism with a card inserted, but omitting the top cover.

Referring also to FIG. 7, when a user wants to put a card 70 in a communication device, the card 70 is pushed by a fingertip into the ejection mechanism 1. When the card 70 is moved towards the first sidewall 210, the card 70 presses the handle portion 505 of the sliding block 50, the sliding block 50 is driven to move towards the first sidewall 210 via friction between the card 70 and the sliding block 50, and the elastic member 30 is compressed. Because the elevation of the first sliding rail 526 adjacent to the joint 528a of the first and third sliding rails 526, 528 is higher than the elevation of the third sliding rail 528 adjacent to the joint 528a of the first and third sliding rails 526, 528, the distal end of the second rod portion 420 slides in the first sliding rail 526. When the distal end of the second rod portion 420 slides into the third sliding rail 528 and is fixed in the second tip of the second protrusion 540, the second rod portion 420 of the elastic rod is located at a locking position, and then the user can stop pushing on the card, the card 70 stops moving back with most of the card 70 received in the ejection mechanism 1 and a distal end of the card 70 being exposed outside the ejection mechanism 1 from the opening 224. The first sliding rail 526 and third sliding rail 528 serve as an insertion rail.

When the user wants to remove the card 70, the user can apply a force using a fingertip to the distal end of the card 70 exposed outside the opening 224, to drive the card 70 to move towards the first sidewall 210. The sliding block 50 moves towards the first sidewall 210 together with the card 70 via friction, and the distal end of the second rod portion 420 of the elastic rod 40 is removed from the locking position and slides into the fourth sliding rail 529. When the user takes away his fingertip, the sliding block 50 is driven to move towards the opening 224 by the compressive force of the elastic member 30. Because the elevation of the fourth sliding rail 529 adjacent to the joint 529a of the fourth and second sliding rails 529, 527 is higher than the elevation of the second sliding rail 527 adjacent to the joint 529a of the fourth and second sliding rails 529, 527, when the sliding block moves towards the opening 224, the distal end of the second rod portion 420 of the elastic rod 40 slides into the second sliding rail 527 from the fourth sliding rail 529, and slides in the second sliding rail 527 until the distal end of the second rod portion 420 slides into the first sliding rail 526, thereby the card 70 is removed from the opening 224. The fourth sliding rail 529 and the second sliding rail 527 serve as an ejection rail.

The teeth 259 slow the rate of ejection of the card, to prevent the card being projected onto the floor or elsewhere, and the card can be removed very easily from the ejection mechanism.

It is believed that the present embodiments and their advantages will be understood from the foregoing description, and it will be apparent that various changes may be made thereto without departing from the spirit and scope of the description or sacrificing all of their material advantages, the examples hereinbefore described merely being exemplary embodiments.

What is claimed is:

1. An ejection mechanism for ejecting a card, the ejecting mechanism comprising:
a bottom cover comprising a first sidewall and a second sidewall opposite to the first sidewall, the second sidewall defining an opening for inserting the card;
a sliding assembly comprising a sliding block, an elastic member and an elastic rod, the sliding block defining a containing groove which is divided into an insertion rail and an ejection rail, the sliding block configured to move back and forth between the first and second sidewalls, a first distal end of the elastic rod fixed in a fixing hole of the first sidewall, a second distal end of the elastic rod received in the containing groove and configured for sliding in the containing groove; and a top cover configured for engaging with the bottom cover to receive the sliding assembly;

wherein when the card is inserted into the ejection mechanism via the opening by an external force, the sliding block moves towards the first sidewall in unison with the card, the elastic member is compressed, and the second distal end of the elastic rod slides along the insertion rail until the second distal end of the elastic rod is locked in a joint of the insertion and ejection rails, and then the external force is released, and a distal end of the card is exposed outside the ejection mechanism; when another external force is applied to the distal end of the card exposed outside the opening to drive the card to move towards the first sidewall, and the second distal end of the elastic rod disengages from the locking position, then the compressed elastic member drives the sliding block to move towards the opening, the second distal end of the elastic rod slides in the ejection rail, and the card moves towards the opening and is ejected from the ejection mechanism.

2. The ejection mechanism of claim 1, wherein the sliding block includes a main body and a handle portion connected to the main body, the containing groove is defined on a top surface of the main body, when the card is inserted into the opening, the card presses the handle portion, and the sliding block moves in unison with the card by frictional forces between the card and the sliding block.

3. The ejection mechanism of claim 2, wherein the sliding block comprises a first side edge, a second side edge, a third side edge, a fourth side edge, and a fifth side edge connecting end to end to bound the first containing groove, the first side edge and the third side edge extend along a first axis perpendicular to the first and second sidewalls, the second side edge and the fifth side edge extend along a second axis parallel to the first and second sidewalls, the fourth side edge is curved, and interconnects the third and fifth side edges, a length of the first side edge is greater than a length of the third side edge, and a length of the second side edge is greater than a length of the fifth side edge.

4. The ejection mechanism of claim 3, wherein the sliding block further comprises a first protrusion and a second protrusion which are located in the first containing groove, the first protrusion connects to the second side edge, and includes a first tip pointing to the fifth side edge, the second protrusion is located between the first protrusion and the fifth side edge, and the second protrusion includes two stacked V-shaped boundaries connected end to end to form a heart-shaped profile, the bottom V-shaped boundary of the second protrusion comprises a second tip pointing to the fifth side edge, and the top V-shaped boundary of the second protrusion includes a third tip pointing to the fifth side edge; the bottom V-shaped boundary of the second protrusion forms a first sliding rail between the fourth side edge and the second tip of the second protrusion and a second sliding rail between the second tip of the second protrusion and the first side edge, the top V-shaped boundary of the second protrusion and the first tip of the first protrusion form a third sliding rail between the third side edge and the third tip of the second protrusion, and a fourth sliding rail between the third tip of the second protrusion and the first side edge.

5. The ejection mechanism of claim 4, wherein the first and third sliding rails serve as the insertion rail, and the fourth and second sliding rails serve as the ejection rail, an elevation of the first sliding rail adjacent to a joint of the first and third sliding rails is higher than an elevation of the third sliding rail adjacent to the joint of the first and third sliding rails, thereby forming a first step between the first and third sliding rails, an elevation of the fourth sliding rail adjacent to a joint of the fourth and second sliding rails is higher than an elevation of the second sliding rail adjacent to the joint of the fourth and second sliding rails, thereby forming a second step between the fourth and second sliding rails, the second sliding rail becomes gradually higher in elevation along a direction of the second sliding rail near to the fifth side edge, and thus the elevation of the second sliding rail adjacent to a joint of the second and first sliding rails is higher than an elevation of the first sliding rail adjacent to the joint of the second and first sliding rails, thereby forming a third step between the second and first sliding rails.

6. The ejection mechanism of claim 5, wherein the bottom cover further comprises a bottom plate, a third sidewall, and a fourth sidewall opposite to the third sidewall, the first and second sidewalls perpendicularly extend from two opposite sides of the bottom plate, and the third and fourth sidewalls perpendicularly extend from the other two opposite sides of the bottom plate, the sidewalls and the bottom plate define an accommodating space, the opening communicates with the accommodating space, the bottom plate defines a limiting groove to limit the main body moving in the limiting groove, a sliding slot passes through a bottom of the limiting groove, two limiting blocks connected to a bottom surface of the main body is received in the sliding slot.

7. The ejection mechanism of claim 6, wherein the sliding slot comprises a first sliding portion, a second sliding portion, and a curved sliding portion interconnected the first and second sliding portions, the first and second sliding portions are parallel to the first axis, the first sliding portion is closer to the third sidewall relative to the second sliding portion, and the first sliding portion is closer to the first sidewall relative to the second sliding portion, and two opposite long sidewalls which bound the second sliding portions comprise a plurality of teeth.

8. The ejection mechanism of claim 7, wherein a fixing pole is connected to the first sidewall, the elastic member is sleeved on the fixing pole, the elastic member is limited between the first sidewall and the sliding block, the elastic member exerts a resilient force on the sliding block when compressed or stretched.

9. The ejection mechanism of claim 8, wherein the elastic rod comprises a first rod portion, a second rod portion, and a third rod portion. The first and second rod portions extend along a third axis perpendicular to the first and second axes, the third rod portion perpendicularly interconnects the first and second rod portions, the first rod portion comprises the first distal end, and the second rod portion comprises the second distal end.

10. The ejection mechanism of claim 9, wherein the top cover defines a window at a top surface thereof and an elastic pressing pole connecting with the top surface and extending across the window, the elastic pressing pole having a center portion which is lower than the top surface of the top cover.

11. A communication device, comprising:
an ejection mechanism comprising:
a bottom cover comprising a first sidewall and a second sidewall opposite to the first sidewall, the second sidewall defines an opening for inserting the card;
a sliding assembly comprising a sliding block, an elastic member and an elastic rod, the sliding block defining a containing groove which is divided into an insertion rail and an ejection rail, the sliding block configured to move back and forth between the first and second sidewalls, a first distal end of the elastic rod fixed in a fixing hole of the first sidewall, a second distal end of the elastic rod received in the containing groove and configured for sliding in the containing groove; and a top cover configured for engaging with the bottom cover to receive the sliding assembly;

wherein when the card is inserted into the ejection mechanism via the opening by an external force, the sliding block moves towards the first sidewall in unison with the card, the elastic member is compressed, and the second distal end of the elastic rod slides along the insertion rail until the second distal end of the elastic rod is locked in a joint of the insertion and ejection rails, and then the external force is released, and a distal end of the card is exposed outside the ejection mechanism; when another external force is applied to the distal end of the card exposed outside the opening to drive the card to move towards the first sidewall, and the second distal end of the elastic rod disengages from the locking position, then the compressed elastic member drives the sliding block to move towards the opening, the second distal end of the elastic rod slides in the ejection rail, and the card moves towards the opening and is ejected from the ejection mechanism.

12. The communication device of claim 11, wherein the sliding block includes a main body and a handle portion connected to the main body, the containing groove is defined on a top surface of the main body, when the card is inserted into the opening, the card presses the handle portion, and the sliding block moves in unison with the card by a frictional force between the card and the sliding block.

13. The communication device of claim 12, wherein the sliding block comprises a first side edge, a second side edge, a third side edge, a fourth side edge, and a fifth side edge connecting end to end to bound the first containing groove, the first side edge and the third side edge extend along a first axis perpendicular to the first and second sidewalls, the second side edge and the fifth side edge extend along a second axis parallel to the first and second sidewalls, the fourth side edge is curved, and interconnects the third and fifth side edges, a length of the first side edge is greater than a length of the third side edge, and a length of the second side edge is greater than a length of the fifth side edge.

14. The communication device of claim 13, wherein the sliding block further comprises a first protrusion and a second protrusion which are located in the first containing groove, the first protrusion connects to the second side edge, and includes a first tip pointing to the fifth side edge, the second protrusion is located between the first protrusion and the fifth side edge, and the second protrusion includes two stacked V-shaped boundaries connected end to end to form a heart-shaped profile, the bottom V-shaped boundary of the second protrusion comprises a second tip pointing to the fifth side edge, and the top V-shaped boundary of the second protrusion includes a third tip pointing to the fifth side edge; the bottom V-shaped boundary of the second protrusion forms a first sliding rail between the fourth side edge and the second tip of the second protrusion and a second sliding rail between the second tip of the second protrusion and the first side edge, the top V-shaped boundary of the second protrusion and the first tip of the first protrusion form a third sliding rail between the third side edge and the third tip of the second protrusion, and a fourth sliding rail between the third tip of the second protrusion and the first side edge.

15. The communication device of claim 14, wherein the first and third sliding rails serve as the insertion rail, and the fourth and second sliding rails serve as the ejection rail, an elevation of the first sliding rail adjacent to a joint of the first and third sliding rails is higher than an elevation of the third sliding rail adjacent to the joint of the first and third sliding rails, thereby forming a first step between the first and third sliding rails, an elevation of the fourth sliding rail adjacent to a joint of the fourth and second sliding rails is higher than an elevation of the second sliding rail adjacent to the joint of the fourth and second sliding rails, thereby forming a second step between the fourth and second sliding rails, the second sliding rail becomes gradually higher in elevation along a direction of the second sliding rail near to the fifth side edge, and thus the elevation of the second sliding rail adjacent to a joint of the second and first sliding rails is higher than an elevation of the first sliding rail adjacent to the joint of the second and first sliding rails, thereby forming a third step between the second and first sliding rails.

16. The communication device of claim 15, wherein the bottom cover further comprises a bottom plate, a third sidewall, and a fourth sidewall opposite to the third sidewall, the first and second sidewalls perpendicularly extend from two opposite sides of the bottom plate, and the third and fourth sidewalls perpendicularly extend from the other two opposite sides of the bottom plate, the sidewalls and the bottom plate define an accommodating space, the opening communicates with the accommodating space, the bottom plate defines a limiting groove to limit the main body moving in the limiting groove, a sliding slot passes through a bottom of the limiting groove, two limiting block connected to a bottom surface of the main body is received in the sliding slot.

17. The communication device of claim 16, wherein the sliding slot comprises a first sliding portion, a second sliding portion, and a curved sliding portion interconnected the first and second sliding portions, the first and second sliding portions are parallel to the first axis, the first sliding portion is closer to the third sidewall relative to the second sliding portion, and the first sliding portion is closer to the first sidewall relative to the second sliding portion, and two opposite long sidewalls which bound the second sliding portions comprise a plurality of teeth.

18. The communication device of claim 17, wherein a fixing pole is connected to the first sidewall, the elastic member is sleeved on the fixing pole, the elastic member is limited between the first sidewall and the sliding block, the elastic member exerts a resilient force on the sliding block when compressed or stretched.

19. The communication device of claim 18, wherein the elastic rod comprises a first rod portion, a second rod portion, and a third rod portion. The first and second rod portions extend along a third axis perpendicular to the first and second axes, the third rod portion perpendicularly interconnects the first and second rod portions, the first rod portion comprises the first distal end, and the second rod portion comprises the second distal end.

20. The communication device of claim 19, wherein the top cover defines a window at a top surface thereof and an elastic pressing pole connecting with the top surface and extending across the window, the elastic pressing pole having a center portion which is lower than the top surface of the top cover.

* * * * *